United States Patent
Yoshikawa et al.

(10) Patent No.: US 7,848,059 B2
(45) Date of Patent: Dec. 7, 2010

(54) MAGNETORESISTIVE EFFECT DEVICE AND MAGNETIC RANDOM ACCESS MEMORY USING THE SAME

(75) Inventors: Masatoshi Yoshikawa, Yokohama (JP); Tadashi Kai, Tokyo (JP); Toshihiko Nagase, Sagamihara (JP); Eiji Kitagawa, Sagamihara (JP); Tatsuya Kishi, Yokohama (JP); Hiroaki Yoda, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 680 days.

(21) Appl. No.: 11/858,386

(22) Filed: Sep. 20, 2007

(65) Prior Publication Data

US 2008/0231998 A1 Sep. 25, 2008

(30) Foreign Application Priority Data

Sep. 29, 2006 (JP) ............................. 2006-269517

(51) Int. Cl.
*G11B 5/39* (2006.01)
(52) U.S. Cl. ..................................... 360/313
(58) Field of Classification Search ............... 360/313
See application file for complete search history.

(56) References Cited

U.S. PATENT DOCUMENTS

| | | | |
|---|---|---|---|
| 6,256,223 B1 | 7/2001 | Sun | |
| 7,242,045 B2 | 7/2007 | Nguyen et al. | |
| 7,739,787 B2* | 6/2010 | Shimazawa et al. | 29/603.16 |
| 2002/0154443 A1* | 10/2002 | Kawasaki et al. | 360/126 |
| 2007/0081276 A1* | 4/2007 | Fukuzawa et al. | 360/313 |

FOREIGN PATENT DOCUMENTS

| | | |
|---|---|---|
| CN | 1503912 A | 6/2004 |
| CN | 1674094 A | 9/2005 |
| JP | 2005-32878 | 2/2005 |
| JP | 2005-50907 | 2/2005 |
| JP | 2006-80385 | 3/2006 |
| JP | 2006-179524 | 7/2006 |
| JP | 2006-190838 | 7/2006 |

(Continued)

OTHER PUBLICATIONS

U.S. Appl. No. 12/409,654, filed Mar. 24, 2009, Yoshikawa, et al.

(Continued)

*Primary Examiner*—Mark Blouin
(74) *Attorney, Agent, or Firm*—Oblon, Spivak, McClelland, Maier & Neustadt, L.L.P.

(57) ABSTRACT

A magnetoresistive effect element includes a magnetization fixed layer having substantially fixed magnetization direction. A magnetization variable layer has a variable magnetization direction, consists of a magnetic alloy that has a BCC structure and is expressed by $Fe_{1-x-y}Co_xNi_y$ ($0 \leq x+y \leq 1$, $0 \leq x \leq 1$, $0 \leq y \leq 1$), and contains at least one additive element of V, Cr, and Mn in a range of $0 < a \leq 20$ at % (a is a content). An intermediate layer is disposed between the magnetization fixed layer and the magnetization variable layer and consists of a nonmagnetic material. The magnetization direction of the magnetization variable layer is switched by a bidirectional current passing through the magnetization fixed layer, the intermediate layer, and the magnetization variable layer.

15 Claims, 4 Drawing Sheets

FOREIGN PATENT DOCUMENTS

| | | |
|---|---|---|
| JP | 2007-48790 | 2/2007 |
| JP | 2007-305629 | 11/2007 |
| JP | 2009-521807 | 6/2009 |
| KR | 10-2001-0021255 | 3/2001 |
| WO | WO 2005/079528 | 9/2005 |
| WO | WO 2006/063007 | 6/2006 |

OTHER PUBLICATIONS

J.C. Slonczewski, "Current-driven excitation of magnetic multilayers", Journal of Magnetism and Magnetic Materials, vol. 159, 1996, pp. L1-L7.

Japanese Office Action with English translation dated Aug. 3, 2010 in Application No. 2007-249596, 11 pages.

\* cited by examiner

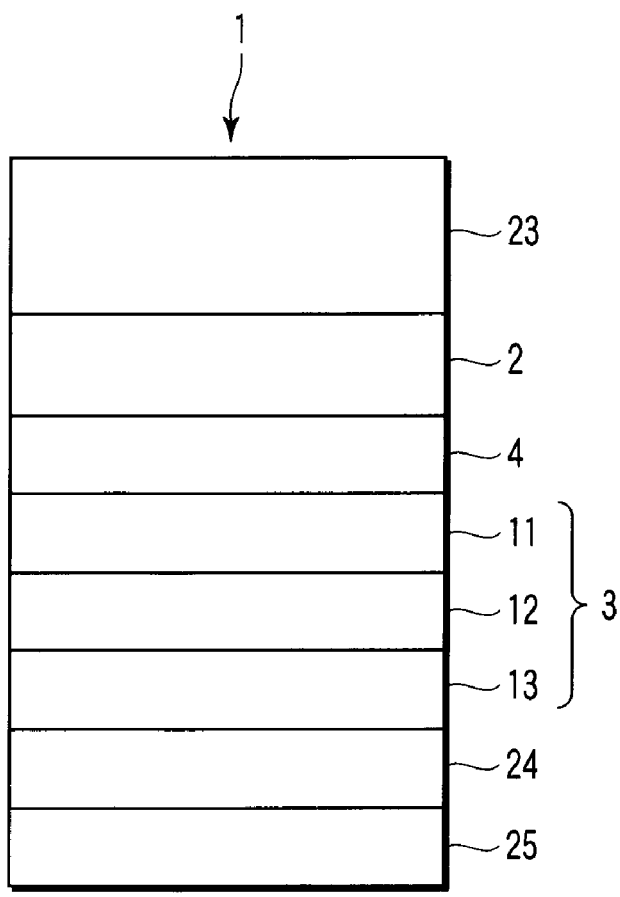
F I G. 9
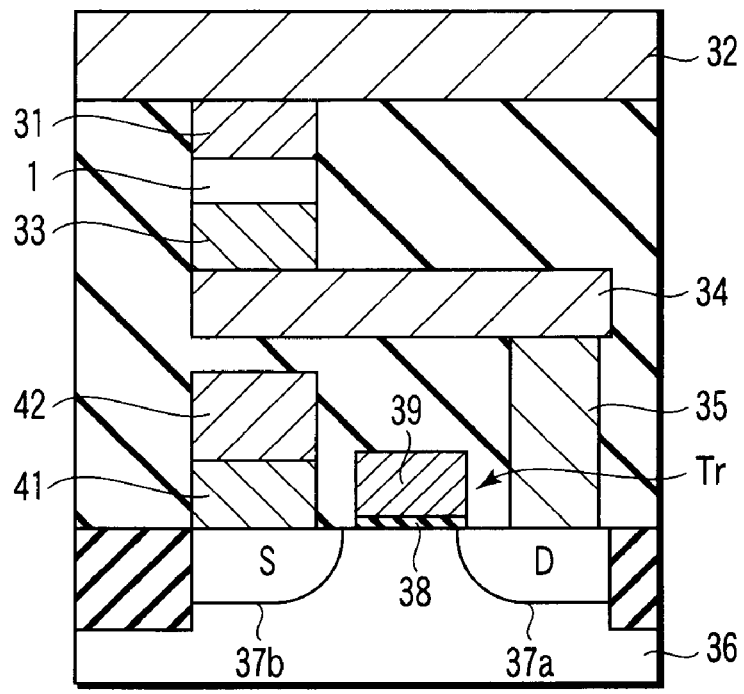
F I G. 10

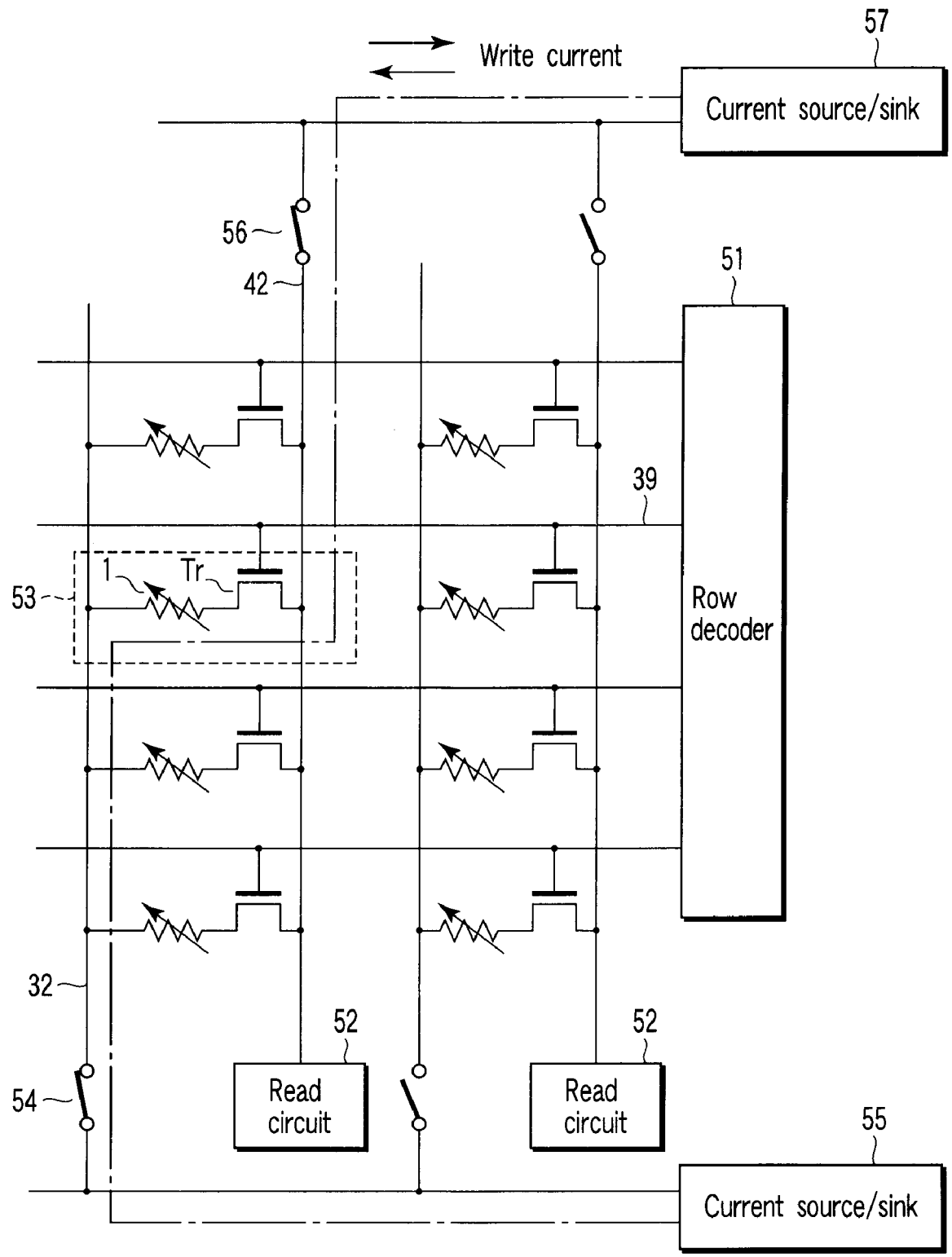
F I G. 11

MAGNETORESISTIVE EFFECT DEVICE AND MAGNETIC RANDOM ACCESS MEMORY USING THE SAME

CROSS-REFERENCE TO RELATED APPLICATIONS

This application is based upon and claims the benefit of priority from prior Japanese Patent Application No. 2006-269517, filed Sep. 29, 2006, the entire contents of which are incorporated herein by reference.

BACKGROUND OF THE INVENTION

1. Field of the Invention

The present invention relates to a magnetoresistive effect device and a magnetic random access memory using the same, for example, a magnetoresistive effect device using a spin-injection writing scheme.

2. Description of the Related Art

In recent years, there have been proposed a large number of solid-state memories on which information is recorded on the basis of new principles. Of the solid-state memories, as a solid-state magnetic memory, a magnetoresistive random access memory (MRAM) using a tunneling magnetoresistance (TMR) is known. The MRAM uses a magnetoresistive (MR) device which exerts a magnetoresistive effect as a memory cell to store information in a memory cell depending on a state of magnetization of the MR element.

An MR element includes a layer having variable magnetization and a layer having fixed magnetization. When the direction of magnetization of the variable-magnetization layer is parallel to that of the fixed-magnetization layer, a low resistance state appears. When the directions are opposite to each other, a high resistance state appears. The difference between the resistance states is used to store information.

As a method of writing information in the MR element, a so-called current-magnetic-field writing scheme is used. In this scheme, interconnects are arranged near the MR element, and a magnetic field generated by a current flowing in the interconnects changes states of magnetization of the MR element. When the MR element is reduced in size to shrink the MRAM, the MR element increases in coercivity Hc. For this reason, in the MRAM using the magnetic-field writing scheme, with advance of shrinkage, a current required for writing tends to increase. As a result, shrinkage of a cell size for a large capacity over 256 Mbits and a low-current configuration is not easily compatible.

A wiring scheme using spin momentum transfer (SMT) as a writing scheme (spin-injection writing) that overcomes the above problem is proposed (specification of U.S. Pat. No. 6,256,223). In the spin-injection writing scheme, a current is conducted perpendicularly to surfaces where respective films face in a device (MR element) which achieves tunneling magnetoresistance to change (switch) states of magnetization of the MR element.

In magnetization switching by spin injection, a current Ic required for magnetization switching is accurately regulated by a current density Jc. Therefore, when an area of surface through which a current of the MR element flows decreases, the injection current Ic to switch magnetization also decreases. With constant current density for writing, reduced-sized MR element requires decreased current Ic. This makes the spin-injection writing scheme outperform the magnetic-field writing scheme in scalability in principle.

However, when the spin-injection writing scheme is used to realize an MRAM, a current required for magnetization switching is larger than that generated by a select transistor, which is frequently used to realize an MRAM. For this reason, the MRAM cannot be substantially operated as a memory.

BRIEF SUMMARY OF THE INVENTION

According to one aspect of the present invention, there is provided a magnetoresistive effect element comprising: a magnetization fixed layer having substantially fixed magnetization direction; a magnetization variable layer having a variable magnetization direction, formed of a magnetic alloy that has a BCC structure and is expressed by $Fe_{1-x-y}Co_xNi_y$ ($0 \leq x+y \leq 1$, $0 \leq x \leq 1$, $0 \leq y \leq 1$), and containing at least one additive element of V, Cr, and Mn in a range of $0 < a \leq 20$ at % (a is a content); and an intermediate layer disposed between the magnetization fixed layer and the magnetization variable layer and formed of a nonmagnetic material, wherein the magnetization direction of the magnetization variable layer is switched by a bidirectional current passing through the magnetization fixed layer, the intermediate layer, and the magnetization variable layer.

According to one aspect of the present invention, there is provided a magnetoresistive effect element comprising: a magnetization fixed layer having substantially fixed magnetization direction; a magnetization variable layer having a variable magnetization direction, formed of a magnetic alloy that has a BCC structure and is expressed by $Fe_{1-x-y}Co_xNi_y$ ($0 \leq x+y \leq 1$, $0 \leq x \leq 1$, $0 \leq y \leq 1$), and containing at least one additive element of Si, Ge, and Ga in a range of $0 < a \leq 5$ at % (a is a content); and an intermediate layer disposed between the magnetization fixed layer and the magnetization variable layer and formed of a nonmagnetic material, wherein the direction of magnetization of the magnetization variable layer is switched by a bidirectional current passing through the magnetization fixed layer, the intermediate layer, and the magnetization variable layer.

According to one aspect of the present invention, there is provided a magnetoresistive effect element comprising: a magnetization fixed layer having substantially fixed magnetization direction; a magnetization variable layer having a variable magnetization direction, formed of a magnetic alloy that has a BCC structure and is expressed by $Fe_{1-x-y}Co_xNi_y$ ($0 \leq x+y \leq 1$, $0 \leq x \leq 1$, $0 \leq y \leq 1$), and containing at least one additive element of Sr, Ti, Y, Zr, Nb, Mo, Tc, Hf, Ta, W, and Re in a range of $0 < a \leq 10$ at % (a is a content); and an intermediate layer disposed between the magnetization fixed layer and the magnetization variable layer and formed of a nonmagnetic material, wherein the magnetization direction of the magnetization variable layer is switched by a bidirectional current passing through the magnetization fixed layer, the intermediate layer, and the magnetization variable layer.

According to one aspect of the present invention, there is provided a magnetoresistive effect element comprising: a magnetization fixed layer having substantially fixed magnetization direction; a magnetization variable layer having a variable magnetization direction, formed of a magnetic alloy expressed by $Fe_{1-x-y}Co_xNi_y$ ($0 \leq x+y \leq 1$, $0 \leq x \leq 1$, $0 \leq y \leq 1$), and containing at least one of Ru, Rh, Pd, Os, Ir, Pt, Au, and Ag; and an intermediate layer disposed between the magnetization fixed layer and the magnetization variable layer and formed of a nonmagnetic material, wherein the magnetization direction of the magnetization variable layer is switched by a bidirectional current passing through the magnetization fixed layer, the intermediate layer, and the magnetization variable layer.

BRIEF DESCRIPTION OF THE SEVERAL VIEWS OF THE DRAWING

FIGS. 1 to 9 each show basic parts of an MR element according to one embodiment;

FIG. 10 shows a basic part of a memory cell using the MR element according to one embodiment; and FIG. 11 shows a circuit diagram of an MRAM using the MR element according to one embodiment.

DETAILED DESCRIPTION OF THE INVENTION

Figure 1:
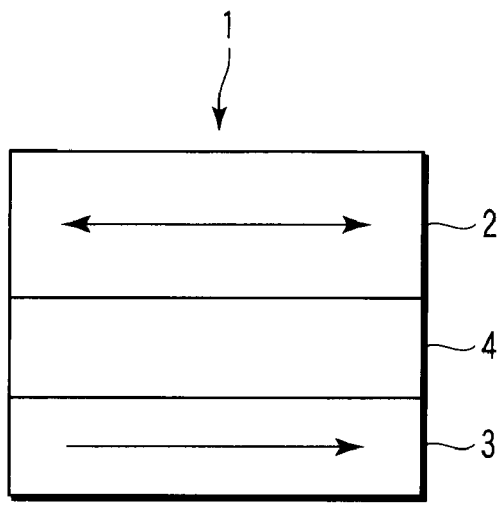

An embodiment of the present invention will be described below with reference to the accompanying drawings. The same reference numerals in the following description denote constituent elements having the same functions and configurations, and a repetitive description is performed only when needed.

(1) MR ELEMENT

(1-1) Structure of MR Element

Figure 2:
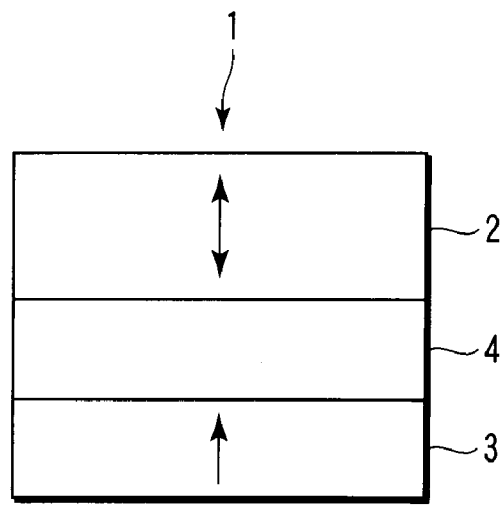

FIGS. 1 and 2 each show basic parts of an MR element according to one embodiment of the present invention. In FIGS. 1 and 2, arrows indicate directions of magnetizations. In the following drawings, basic parts of the MR element are shown. However, the MR element may further include layers so long as it includes the basic configuration.

An MR element 1 is configured to take one of two stationary states depending on a direction of a current flowing through a surface (film surface) where layers face each other. The stationary states correspond to "0" data and "1" data, respectively, to allow for storing binary data in the MR element 1. In the MR element 1, states of magnetizations switches by the spin-injection writing scheme, and information depending on the states is stored.

As shown in FIG. 1, the MR element 1 has two ferromagnetic layers 2 and 3 and a spacer layer (intermediate layer) 4 arranged between the ferromagnetic layers 2 and 3. The ferromagnetic layer 2 has an easy magnetization axis in a direction along the film surface to make the direction of magnetization variable along the film surface. In the following description, the ferromagnetic layer 2 is called a free layer (free layer, magnetization free layer, magnetization variable layer, or recording layer). Detailed characteristics including the configuration of the free layer 2 will be described later. Magnetization along the film surface is called in-plane magnetization.

The ferromagnetic layer 3 has a direction of magnetization fixed along the film surface. More specifically, the ferromagnetic layer 3 is an in-plane magnetization film. The ferromagnetic layer 3 may be designed to have a coercivity higher than that of the free layer 2. The ferromagnetic layer 3 will be called a pin layer (fixed layer, magnetization fixed layer, reference layer, magnetization reference layer, standard layer, or magnetization standard layer). A direction of an easy magnetization axis of the free layer 2 is typically along the direction of magnetization of the pin layer 3.

The magnetization of the pin layer 3 can be fixed by arranging an antiferromagnetic layer (not shown) on, for example, a surface of the pin layer 3 opposing the spacer layer 4. The pin layer 3 can consist of, for example, Co, Fe, Ni, or an alloy containing these metals.

The spacer layer (intermediate layer) 4 is constituted by a non-magnetic metal film, a non-magnetic semiconductor film, an insulating film, or the like. Preferably, the spacer layer 4 is an oxide spacer layer or a nitride spacer layer formed of MgO, CaO, SrO, TiO, or TiN having an NaCl structure. The spacer layer 4 having the NaCl structure preferably has (100) planar orientation. Although will be described later, this is because lattice mismatch decreases on an interface between the spacer layer 4 and the free layer 2 having a body-centered cubic (BBC) structure having (100) planar orientation, or the free layer 2 having an $L1_0$ ordered structure phase or an $L1_2$ ordered structure phase having (001) planar orientation.

In writing, a current is conducted to flow from the pin layer 3 to the free layer 2 or from the free layer 2 to the pin layer 3 in a direction penetrating the film surface (typically, perpendicular to the film surface). As a result, a spin angular momentum transferred from the pin layer 3 to the free layer 2, where the momentum is transferred to spin of the free layer 2 according to a law of conservation of the spin angular momentum, resulting in a magnetization switching of the free layer 2.

FIG. 2 shows an example in which directions of magnetizations of the free layer 2 and the pin layer 3 are different from those in FIG. 1. More specifically, as shown in FIG. 2, an easy magnetization axis of the free layer 2 and a magnetization of the pin layer 3 are along a direction penetrating the film surface (typically, direction perpendicular to the film surface), and a magnetization of the free layer 2 rotates along a surface perpendicular to the film surface. Magnetization in the direction penetrating the film surface is called perpendicular magnetization.

When the easy magnetization axis of the free layer 2 is set in the perpendicular magnetization direction, MR-element size-dependence is reduced to allow for realization of an MR element having an aspect ratio of 1. This enables reduced aspect ration to accordingly decrease the element area, which reduces the switching current.

The pin layer 3 having perpendicular magnetization is thicker than the free layer 2 and preferably has a product MS·t of a saturation magnetization Ms and a thickness t, or a uniaxial magnetic anisotropic energy Ku that are sufficiently larger (three or more times) than those of the free layer 2. This is to efficiently perform spin accumulation effect in the pin layer 3, i.e., transfer of angular momentum from magnetization spin to conduction electrons and to minimize fluctuation of magnetization of the pin layer 3 caused by injection of spin from the free layer 2.

When the pin layer 3 has perpendicular magnetization, a leakage magnetic field from the pin layer 3 is preferably reduced. The leakage magnetic field of the pin layer 3 prevents a magnetization of the free layer 2 from being switched from parallel to antiparallel with respect to the pin layer 3. Therefore, an apparent saturation magnetization Ms (net-Ms) of the pin layer 3 is preferably small.

Figure 3:
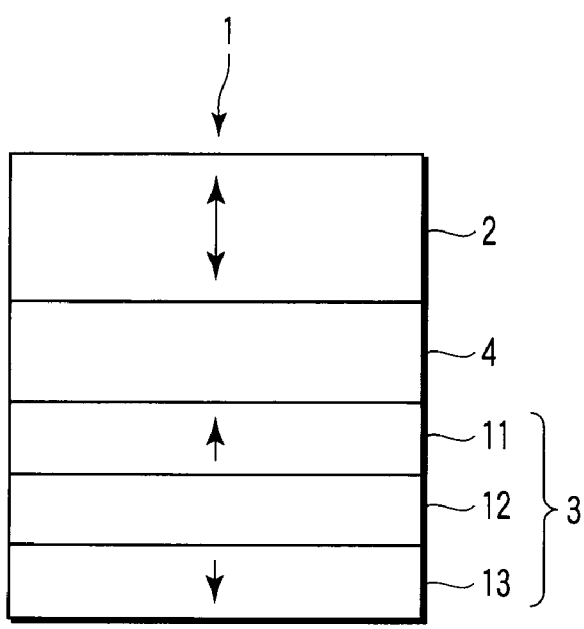

As one method for the purpose, a synthetic antiferro (SAF) structure can be given to the pin layer 3. The SAF structure, as shown in FIG. 3, is constituted by a laminate structure including a ferromagnetic layer 11, an intermediate layer 12, and a ferromagnetic layer 13. The ferromagnetic layer 11 and the magnetic layer 13 are designed to be stable in an antiparallel magnetization arrangement. As a material of the intermediate layer 12, an element such as Ru or Os is used. In the example in FIG. 3, an SAF structure is applied to the pin layer 3 of the MR element having perpendicular magnetization. However, an in-plane magnetization (FIG. 1) structure can be applied as a matter of course.

Figure 4:
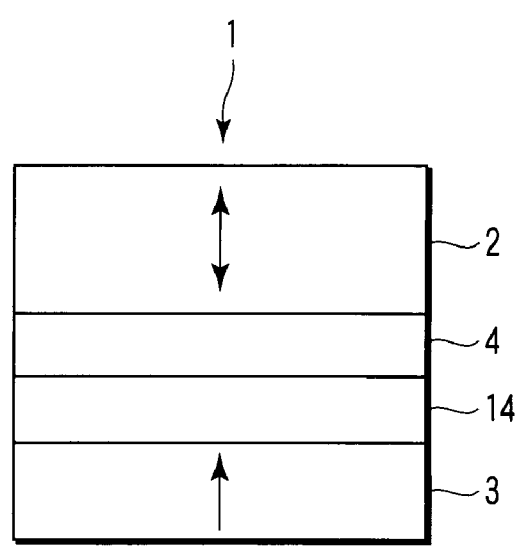

As another method of reducing a leakage magnetic field of the pin layer 3 having perpendicular magnetization, the pin layer 3 can consist of a ferrimagnetic material. In this case, as shown in FIG. 4, an interface pin layer 14 is inserted into an interface between the pin layer 3 and the spacer layer 4 to cause an MR ratio to appear. As the ferrimagnetic material, an FeCo-RE material (RE is a rare-earth element) is typically used. As the RE, Gd, Tb, Dy, and Ho are preferably used to stabilize perpendicular magnetization. An FeCo-RE alloy has an amorphous structure. In the FeCo-RE alloy, the saturation magnetization Ms is almost zero by an RE composition near a compensation point, a carrier of the saturation magnetization Ms is changed from FeCo to an RE element, and a coercivity Hc becomes relative maximum. Therefore, with the composition that makes the RE element rich, apparent saturation magnetization net-Ms of the interface pin layer 14 and the pin layer 3 can be almost zero.

In the structures in FIGS. 1 and 2, lamination sequences may be reversed. More specifically, the structures may be vertically reversed.

Figure 5:
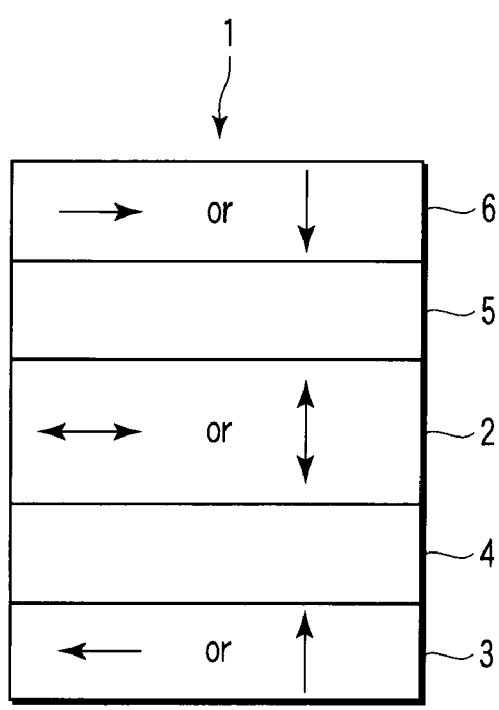

Furthermore, the MR element 1 may have a structure having two pin layers (dual pin structure). FIG. 5 shows another example of the MR element. As shown in FIG. 5, a spacer layer 5 and a pin layer 6 are further arranged on a surface of the free layer 2 opposing the spacer layer 4. The free layer 2 and the pin layers 3 and 6 may have in-plane magnetization as in FIG. 1 (magnetization indicated by arrows in the left part of FIG. 5) or may have perpendicular magnetization (magnetization indicated by arrows in the right part of FIG. 5) as in FIG. 2. A material of the spacer layer 5 can be selected from the materials used in the spacer layer 4, and a material of the pin layer 6 is selected from the materials used in the pin layer 3. A magnetization of the pin layer 3 and a magnetization of the pin layer 6 are antiparallel-coupled to each other.

Figure 6:
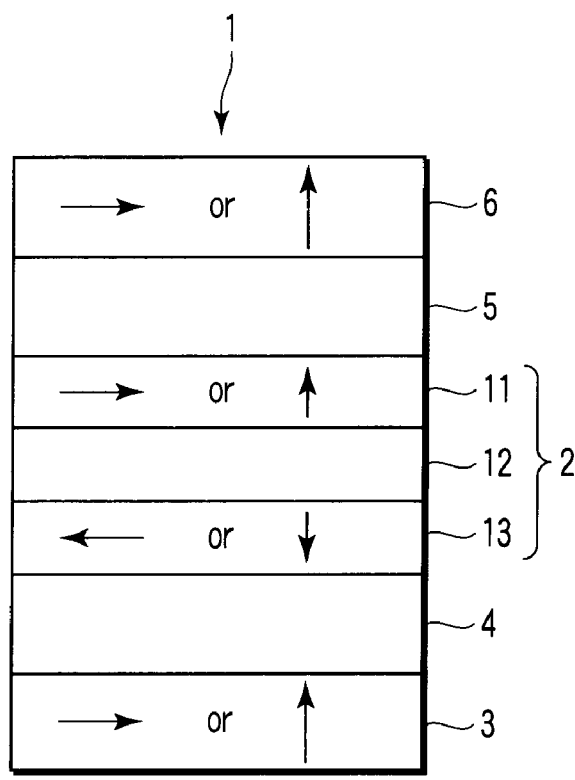

In addition to the dual spin structure, the free layer 2 may have the SAF structure. In the SAF structure, as shown in FIG. 6, the free layer 2 has a laminate structure constituted by the ferromagnetic layer 11, the intermediate layer 12, and the magnetic layer 13. The free layer 2 and the pin layers 3 and 6 may have the same in-plane magnetization as that in FIG. 1 (magnetization indicated by arrows in the left part of FIG. 5) or may have perpendicular magnetization as in FIG. 2 (magnetization indicated by arrows in the right part of FIG. 5). A direction of magnetization of the pin layer 3 is parallel to a direction of magnetization of the pin layer 6, and a magnetization of the ferromagnetic layer 11 is antiparallel-coupled to a magnetization of the magnetic layer 13. As the intermediate layer 12, for example, elements such as Os, Ru, and Ir are used. A free layer 2 having a single pin structure (FIGS. 1 and 2) can be replaced with the free layer 2 having the SAF structure as a matter of course.

The advantage of the SAF structure is that an apparent saturation magnetization net-Ms of the SAF structure is almost zero in a remanent magnetization state (i.e., with no external magnetic field). With the characteristics, the pin layers 3 and 6 of the SAF structure of the MR element and the free layer 2 having the SAF structure are insensitive to an external magnetic field and have improved resistance to the external magnetic field.

(1-2) Free Layer

Details of the free layer 2 will be described below. The following description is applied to both the ferromagnetic layers 11 and 13 when the free layer 2 has an SAF structure.

A current (switching current) Isw required to switch a magnetization of the free layer 2 in spin injection writing is given by the following expression:

$$Isw \propto (\alpha/g) \cdot Ms \cdot V(2 \cdot Ku/Ms + Hd) \quad (1)$$

where
$\alpha$: damping constant
g: efficiency
Ms: saturation magnetization
V: volume
Ku: magnetic anisotropic energy
Hd: demagnetizing field.

The switching current is an average of switching currents for switching magnetizations of the free layer 2 from parallel and antiparallel to antiparallel and parallel to the pin layer 3, respectively. The uniaxial magnetic anisotropic energy Ku is obtained by adding a crystal magnetic anisotropy Kc and an induced magnetic anisotropy Ki.

By reducing physical values in a right side member of Expression (1) other than g, a switching current can be reduced. Some physical values can be the target for reduction and the damping constant $\alpha$ is possible.

The damping constant $\alpha$, which is a physical constant, depends on spin-orbit interaction (1-s coupling) from a microscopic viewpoint. It also depends on the electronic density of majority electrons and minority electrons.

From a macroscopic viewpoint, in practice, an influence of use of a polycrystalline film having a finite crystal grain size is also significant. In the case of a polycrystalline thin film, the damping constant that contributes to a spin-injection magnetization switching current varies because of the influence of a film form. For example, as the roughness of the film is reduced, the damping constant is reduced. Therefore, the flatness and smoothness is indispensable to the free layer. In addition, the crystal orientation also influences the flatness of the film. As the crystal orientation is increased, the damping constant is reduced.

The damping constant also varies depending on a change in the demagnetizing field caused by the saturation magnetization of a magnetic thin film. Therefore, as the distribution of the demagnetizing field is increased, the damping constant is increased. The absolute value of variance of the demagnetizing field is reduced by reducing the saturation magnetization Ms, with the result that the damping constant is also reduced.

When a device is formed using a perpendicular magnetic film, the demagnetizing field coefficient changes because of an effect of the shape by reducing the size of an MTJ element. Therefore, the demagnetizing field of an MR element in the direction perpendicular to the film surface becomes small. Thus, the damping constant is reduced.

As described above, spin-polarized electrons are supplied from the pin layer 3 to the free layer 2 to give torque to the spin of the electrons of the free layer 2 to switch the magnetization of the free layer 2. At this time, free electrons in the free layer 2 exhibit force to return to a magnetically-stable state against a change in magnetization of the free layer 2 caused by the spin torque. This force means the damping constant $\alpha$. The damping constant α functions as force for preventing switching at the beginning of a process of magnetization switching. Therefore, when the damping constant α is reduced, a spin-injection magnetization switching current can be reduced.

(1-2-1) Additive 1

A material of the free layer 2 according to one embodiment of the present invention is a magnetic alloy (FeCoNi alloy) having a composition formula $Fe_{1-x-y}Co_xNi_y$ ($0 \leq x+y \leq 1$, $0 \leq x, y \leq 1$) and contains at least one element N selected from V, Cr, and Mn.

Furthermore, the FeCoNi alloy preferably has a BCC structure. More specifically, the composition of FeCoNi is $Fe_{1-x-y}Co_xNi_y$ ($0 \leq x+y < 0.2$, $0 \leq x < 0.2$, $0 \leq y < 0.2$). When x and y fall within these ranges, the FeCoNi alloy has the BCC structure.

Since the BCC structure is not a close-packed structure, an interatomic distance is large. For this reason, characteristics as an element is relatively strong, and electrons tend to be relatively localized in an atomic nucleus. Since the damping constant α is in proportion to interaction between spins, the damping constant α becomes small as the electrons of the free layer 2 decrease. When the electrons are localized, the number of electrons inhibiting opposite spinning decreases. As a result, the damping constant α decreases.

As described above, the material of the spacer layer 4 frequently has an NaCl structure. The free layer 2 formed of the material having the BCC structure can be used for the spacer layer 4 to conveniently perform interface matching between the spacer layer 4 and the free layer 2. More specifically, for example, when the spacer layer 4 consists of MgO, mismatching on (100) plane can be suppressed. In a ferromagnetic having a BCC structure containing Fe, Co, and Ni as main components, a misfit between preferentially-oriented (100) plane of MgO and (100) plane of the FeCoNi alloy having the BCC structure can be suppressed no more than 5% by inclining [100] direction by 45°. As a result, the MR element can realize an MR ratio exceeding 100%.

By adding the element N to the FeCoNi alloy, the damping constant α of the MR element can be reduced. As a result, a switching current can be reduced. This reduction is caused by the following mechanism. The damping constant α is in proportion to interaction of a spin orbital. An orbital component (L) of FeCoNi is plus, and orbital components (L) of V, Cr, and Mn are minus. For this reason, by adding the element N to the FeCoNi alloy, the orbital component (L) can be reduced. As a result, the interaction of the spin orbital decreases, and the damping constant α can be reduced consequently.

The reduction of the damping constant α depends on an amount of added element N, and even adding of a small amount of the element N decreases the damping constant α. More specifically, the element N is added in the range of $0 < a \leq 50$ at % (a is a content) because, when an amount of added element N exceeds 50 at %, an MR ratio of the MR element rarely appears. The reason for this appears to be that the saturation magnetization Ms reduces to almost zero and directions of magnetization spin on an interface are canceled out. A more preferable upper limit is given by $a \leq 20$ at %. In consideration of a viewpoint of assuring a large MR ratio, a further preferable upper limit is given by $a \leq 10$ at %.

On the other hand, the lower limit is preferably given by 0.1 at % $\leq a$ because a sufficient effect of reducing the damping constant α is not obtained at less than 0.1 at %.

A reducing effect of the damping constant α by adding an element N is largest when FeCoNi has the BCC structure. This is because the BCC structure is not a close-packed structure.

V, Cr, and Mn having the BCC structure can be completely solid-solved in an BCC-structured FeCoNi, which serves as a master alloy. For this reason, such a material is very stable for a crystal phase.

However, even though the FeCoNi alloy has a face-centered cubic lattice (FCC) structure, adding the element N can also stabilize the BCC structure of the FeCoNi alloy.

In general, forming the free layer 2 by a sputtering method forces the solid-solution state to form, allowing the additive to be solid-solved to 5 at %. This also applies to additives 2 to 4, which will be described later.

A reduction of the saturation magnetization Ms caused by addition of the element N is almost proportional to an amount of added element N. This characteristic feature is different from a characteristic feature where addition of a general metal element up to about 10 at % exhibits a small reduction rate of the saturation magnetization Ms. This also applies to the additives 2 to 4.

The free layer 2 has a volume of a BCC structure portion having a small damping constant α by preferably 50% or more of the entire volume. In this manner, the damping constant α significantly tends to decrease. The remaining portion may have any structure. However, the portion is assumed to be frequently amorphous. An additive over a solid solution range gathers at a crystal grain boundary of the BCC structure and is in an amorphous state. This description also applies to the additives 2 to 4.

(1-2-2) Additive 2

A material of the free layer 2 according to one embodiment of the present invention is a magnetic alloy formed of a material expressed by a composition formula $Fe_{1-x-y}Co_xNi_y$ ($0 \leq x+y \leq 1$, $0 \leq x \leq 1$, $0 \leq y \leq 1$) and contains at least one element M selected from Si, Ge, and Ga.

Furthermore, the FeCoNi alloy preferably has a BCC structure. More specifically, the composition of FeCoNi is $Fe_{1-x-y}Co_xNi_y$ ($0 \leq x+y < 0.2$, $0 \leq x < 0.2$, $0 \leq y < 0.2$). When x and y fall within these ranges, the FeCoNi alloy has the BCC structure.

The damping constant α of the MR element can also be reduced by adding an element M to the FeCoNi alloy for the following reason. That is, as described above, a switching current can be reduced by reducing the damping constant α. Since the damping constant α is proportional to an interaction of spin orbital, the damping constant α becomes small as the number of electrons of the free layer 2 decreases.

Si, Ge, and Ga serving as elements M have force for creating covalent binding. Therefore, Si, Ge, and Ga are added to the FeCoNi alloy to create covalent binding to localize free electrons of the free layer 2, and the number of free electrons that can freely move decreases. As a result, a switching current can be reduced through a reduction of the damping constant α.

An amount of additive is preferably set such that the damping constant α is reduced without breaking the crystal structure of the FeCoNi alloy. More specifically, an amount of additive (content) b is given by $0 < b \leq 5$ at %.

The meaning of the upper limit of the amount of additive is as follows. The element M has the BCC structure. For this reason, adding the element M to the FeCoNi alloy having the BCC structure allows to the element M to be substitutional-solid-solved while keeping the BCC structure. However, the element M is added at more than 5 at %, then the crystal structure of the FeCoNi alloy changes from the BCC structure to an amorphous structure. As a result, an interatomic distance in the structure is equal to that in a close-packed structure, which raises concern for increased damping constant α.

More specifically, when the amount of additive is less than 0.1 at %, a sufficient effect of reducing a the damping constant α cannot be observed. For this reason, the lower limit is preferably set at 0.1 at %≦a.

When the element M is added to FeCoNi having the BCC structure, a lattice constant of the BCC structure of the FeCoNi alloy can be advantageously increased. As a result, a misfit amount on an MgO (100) plane frequently used as the spacer layer 4 is moderated, which reduces area resistance. This is because connections of band structures in MgO are very sensitive to lattice matching. In this case, an MR ratio, which depends on element M and an amount thereof, may not be influenced much.

(1-2-3) Additive 3

A material of the free layer 2 according to one embodiment of the present invention is a magnetic alloy formed of a material expressed by a composition formula $Fe_{1-x-y}Co_xNi_y$ (0≦x+y≦1, 0≦x≦1, 0≦y≦1) and contains at least one element L selected from Sr, Ti, Y, Zr, Nb, Mo, Tc, Hf, Ta, W, and Re.

Furthermore, the FeCoNi alloy preferably has the BCC structure. More specifically, the composition of FeCoNi is $Fe_{1-x-y}Co_xNi_y$ (0≦x+y<0.2, 0≦x<0.2, 0≦y<0.2). When x and y fall within these ranges, the FeCoNi alloy has the BCC structure.

The damping constant α of the MR element can also be reduced by adding an element L to the FeCoNi alloy for the following reason. That is, as described above, a switching current can be reduced by reducing the damping constant α. The damping constant α can also be reduced by reducing interatomic interaction in the free layer 2.

As one method for this purpose, an interatomic distance may be increased. To achieve this, by adding Sr, Ti, Y, Zr, Nb, Mo, Tc, Hf, Ta, W, and Re each having a long closest interatomic distance to the FeCoNi alloy, a crystal structure of atoms contained in the free layer 2 spreads, and an interatomic distance in the free layer 2 increases. As a result, the reduced interaction of electrons can reduce the damping constant α. As a result, a switching current can be reduced.

An amount of additive is preferably set such that the damping constant α is reduced without breaking the crystal structure of the FeCoNi alloy. More specifically, an amount of additive (content) c is given by 0<c≦10 at %.

The meaning of the upper limit of the amount of additive is the same as that for the element M. Briefly, addition over the upper limit changes the crystal structure of the FeCoNi alloy from the BCC structure to an amorphous structure, and makes an interatomic distance of the structure equal to that of a close-packing lattice, which increases the damping constant α.

More specifically, since a sufficient effect of reducing the damping constant α cannot be observed at less than 0.1 at %, the lower limit is preferably given by 0.1 at %≦a.

Nb, Mo, W, Ta, or Re having a more stable BCC structure is more preferably used for the element L.

Like the element M, when the element L is added to FeCoNi having the BCC structure, a lattice constant of the BCC structure of the FeCoNi alloy can be advantageously increased. As a result, a misfit amount on MgO (100) plane, which is frequently used as the spacer layer 4, is moderated to reduce area resistance.

The FeCoNi alloy having the BCC structure described in (1-2-1), (1-2-2), and (1-2-3) has (100) planar orientation. Relations of the orientation of the free layer 2 and that of the spacer layer 4 is as follows.
(100) spacer layer//(100) free layer
[100] spacer layer//[110] free layer
where // means parallel.

(1-2-4) Additive 4

Expression (1) shows that the MR element with reduced volume, more specifically, the free layer with reduced thickness can also reduce a switching current. This is because, in spin injection writing, since a torque acting on the free layer by spin injection acts only near an interface (≦3 nm), a portion being free from the torque increases when the free layer is thickened, and the switching current increases.

The switching current can be reduced by thinning the free layer. However, when the free layer is simply thinned, the MR element is deteriorated in heat resistance. This disadvantageously deteriorates data holding characteristics of a memory cell of an MRAM.

For this reason, high magnetic anisotropic energy is given to the free layer, and the free layer can be reduced in volume while keeping certain heat resistance. With respect to the heat resistance, the following expression is satisfied:

$$\Delta = Ke \cdot V/(kb \cdot T)$$

where
Δ: heat resistance
Ke: effective magnetic anisotropic energy
V: volume of free layer (=S (area of free layer)·t (thickness of free layer)
kb: Bolzmann constant
T: temperature Therefore, at a certain temperature, when the heat resistance Δ and the free layer area S are constant, increased effective magnetic anisotropic energy Ke allows for small free layer thickness t.

The effective magnetic anisotropic energies Ke on a perpendicular magnetic film (for example, FIG. 2) and an in-plane magnetic film (for example, FIG. 1) are different from each other. The effective magnetic anisotropic energy Ke on the perpendicular magnetic film is generally expressed by the following equation:

$$Ke = Ku - 4\pi Ms^2.$$

On the other hand, on the in-plane magnetic film, the following equation is satisfied:

$$Ke = Ku + Ks$$

where
Ks: shape magnetic anisotropic energy

Therefore, the free layer 2 of the MR element according to one embodiment of the present invention is a magnetic alloy formed of a material expressed by a composition formula $Fe_{1-x-y}Co_xNi_y$ (0≦x+y≦1, 0≦x, y≦1) and contains at least one element X selected from Ru, Rh, Pd, Os, Ir, Pt, Au, and Ag. The composition range of the element X is preferably between 20 at % and 80 at %. The element X can give a high uniaxial magnetic anisotropic energy Ku to the free layer 2, and improve corrosion resistance of the free layer 2. When the free layer 2 has high uniaxial magnetic anisotropic energy Ku, the effective magnetic anisotropic energy Ke can be increased. Since the element X is not a magnetic element, when the element X is added, the saturation magnetization Ms decreases as the entire volume of the material. This also contributes to a reduction in spin injection magnetic switching current.

When the free layer 2 has the high uniaxial magnetic anisotropic energy Ku to achieve an effective magnetic anisotropic energy Ke having a certain equal value, the shape magnetic anisotropic energy Ks based upon an MR element shape can be relatively decreased as is apparent from equation (3). As a result, dependence on a size of characteristics of the MR element decreases, and resistance to fluctuation in size of the MR element (memory cell) in the MRAM that uses the MR element is improved. With miniaturization of the MR element, a fluctuation in characteristic caused by a fluctuation in MR element size is conspicuous. For this reason, by using the embodiment, a small (small aspect) MR element can be realized without concerning the fluctuation in size.

When the element X is appropriately added to the free layer 2 to appropriately uniform crystal orientation of the free layer 2, magnetic anisotropy perpendicular to a film surface can be achieved. More specifically, the crystal structure and orientation of the FeCoNi alloy film added with the element X are controlled to make it possible to give perpendicular magnetic anisotropy to the FeCoNi alloy.

More specifically, a CoFeNi—X alloy having a hexagonal close-packed (HCP) structure having a (001) planar orientation, a CoFeNi—X alloy having an FCC structure having a (111) planar orientation, and an FeCoNi—X alloy having a face-centered tetragonal (FCT) structure having a (001) planar orientation can be used. The FCT structure alloy has an ordered structure. As a crystal structure of an ordered phase, the $L1_0$ structure and the $L1_2$ structure are known. To form a phase of an ordered structure having the $L1_0$ structure and the $L1_2$ structure, it is preferable that the composition range of the element X be between 20 at % and 80 at %. Heat treatment is required to form an ordered structure phase. In the above composition range, the ordered structure phase having the $L1_0$ structure and the $L1_2$ structure can easily be formed by suitable heat treatment. The ordered structure phase of the $L1_0$ structure is easily formed in the composition range of the element X between 40 at % and 60 at %. The ordered structure phase the $L1_2$ structure is easily formed in the composition range of the element X between 20 at % and 40 at % and between 60 at % and 80 at %.

(1-2-5) Additional Structure of MR Element

The following embodiment can be added to the embodiment in which the element N, M, or L (to be referred to as an additive element) is added. More specifically, an additive element in the free layer 2 has such a concentration distribution that a content at a position decreases as the position gets close to the spacer layer 4. This is because the concentration of the additive element, which is a nonmagnetic element, is reduced near the interface between the spacer layer 4 and the free layer 2 to make it possible to keep an MR ratio of the MR element 1 high. Since an amount of the additive element is small near the interface, an orbital angular momentum caused by the additive element decreases, and efficiency of torque application by spin injection of the free layer 2 near the interface is improved.

Figure 7:
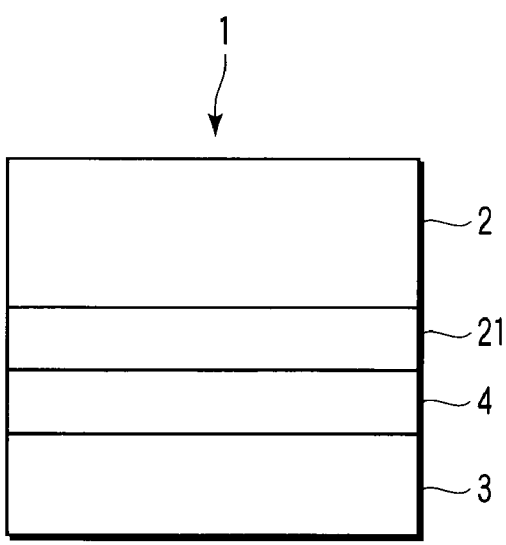

In order to form the concentration distribution as described above, as shown in FIG. 7, a preferred method used may be insertion of an interface free layer 21 free from an additive element between the free layer 2 and the spacer layer 4 to make the free layer 2 a double layer. More specifically, the interface free layer 21 consists of a magnetic alloy expressed by a composition formula $Fe_{1-x-y}Co_xNi_y$ ($0 \leq x+y \leq 1$, $0 \leq x \leq 1$, $0 \leq y \leq 1$). In this case, the interface free layer 21 preferably has a BCC structure. The composition of the FeCoNi alloy in this case may be $Fe_{1-x-y}Co_xNi_y$ ($0 \leq x+y < 0.2$, $0 \leq x < 0.2$, $0 \leq y < 0.2$).

The free layer 2 consists of a material obtained by adding the element N, M, or L to the FeCoNi alloy according to the descriptions (1-2-1), (1-2-2), and (1-2-3).

The MR element having the interface free layer 21 is annealed at an appropriate temperature. As a result, the additive element is diffused from the free layer 2 to the interface free layer 21 to make it possible to realize such a concentration distribution that a content at a position increases as the position gets close to the spacer layer 4.

Figure 8:
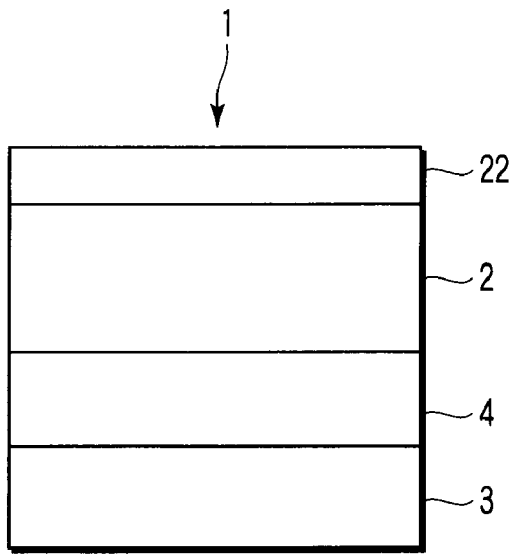

The concentration distribution as described above can also be realized such that, as shown in FIG. 8, a cap layer 22 formed of at least one element X selected from Ru, Rh, Pd, Os, Ir, Pt, and Au is formed on the free layer 2 free from an additive element and then appropriately annealed. The free layer 2 typically has the BCC structure and consists of a material obtained by adding any one of the elements N, M, and L to an FeCoNi alloy (100)-plane oriented according to the descriptions (1-2-1), (1-2-2), and (1-2-3). As the cap layer 22, a material that has an FCC structure and is (100)-plane-oriented is preferably used.

By reducing a concentration of an additive element on the interface of the spacer layer 4, a switching current reducing effect by an additive element is obtained, and an MR ratio of the MR element 1 can be kept high. This is because the MR ratio considerably depends on a state of the interface between the spacer layer 4 and the free layer 2.

A concentration gradient of the additive element in the free layer 2 can be identified by composition analysis by line analysis of a composition by energy-dispersive x-ray diffraction (EDX) or electron energy loss spectroscopy (EELS) in a direction perpendicular to the film surface on a cross section of the layers used in the MR element.

(1-2-6) Atomic Structure of Free Layer

The free layer 2 according to embodiments of the present invention preferably has an $L1_0$ ordered structure phase or an $L1_2$ ordered structure phase. Since an FeCoNi alloy having the $L1_0$ ordered structure phase and the $L1_2$ ordered structure phase exerts a very high crystal magnetic anisotropic energy Kc, the FeCoNi alloy is useful to increase a uniaxial magnetic anisotropic energy Ku. As described above, the high uniaxial magnetic anisotropic energy Ku can reduce a switching current while keeping high heat resistance.

Formation of the $L1_0$ ordered structure phase and the $L1_2$ ordered structure phase is checked by the X-ray diffraction method and the electron diffraction method. In both methods, the diffraction strength is obtained by structure factor calculation by using the strength of electron scattering of each atom. The degree of ordering is evaluated in connection with (002) diffraction, which generally appears, and a (001) peak, which is a superlattice peak that appears as the extinction rule is lost in accordance with the ordering. The degree of ordering is calculated from the ratio between the (001) peak and the (002) peak.

Here, the $L1_0$ ordered structure phase or the $L1_2$ ordered structure phase is defined as a crystal structure obtained when a binary alloy of one element of Fe, Co, and Ni and one element of Ru, Rh, Pd, Os, Ir, Pt, Au, and Ag is considered as a master alloy. For example, as an $L1_0$ structure alloy, an FePt ordered alloy, an FePd ordered alloy, a CoPt ordered alloy, and the like are given. As an $L1_2$ structure alloy, a $Co_3Pt$ ordered alloy, an $Fe_3Pt$ ordered alloy, an $Fe_3Pd$ ordered alloy, and the like are given.

In particular, when the FePt alloy or the CoPt alloy having the $L1_0$ ordered structure phase has a high crystal magnetic anisotropic energy Kc of $5\times10^6$ erg/cc or more, has an FCT structure, and is (001)-plane-oriented, the FePt alloy or the CoPt alloy preferably exerts strong perpendicular magnetic anisotropy. An $Fe_3Pt$ alloy having the $L1_2$ structure and a $Co_3Pt$ alloy having the $L1_2$ ordered structure phase have FCT structures and exhibit high crystal magnetic anisotropic energies Kc of $1\times10^6$ erg/cc or more. When an element selected from V, Cr, and Mn is added to the $Fe_3Pt$ alloy having the $L1_0$ ordered structure phase or the FePt alloy having the $L1_2$ ordered structure phase, the saturation magnetization Ms is greatly reduced for an amount of additive. This is because spin directions of V, Cr, and Mn are opposite to a spin direction of Fe. This is similar to the fact that FeMn, FeCr, and the like have antiferromagnetic properties. The damping constant α also tends to decrease. V, Cr, and Mn are solid-solved in substitution for Fe.

In a magnetization-magnetic field (M-H) curve, perpendicular magnetization refers to a state in which the ratio Mr/Ms between the remanent magnetization Mr in a non-magnetic field and the saturation magnetization Ms is 0.5 or more. In a magnetoresistive effect ratio-magnetic field (MR-H) curve of an MR element, perpendicular magnetization refers to a state in which the ratio MRr/MRs between the MR ratio MRr in a remanent state in a non-magnetic field and the maximum MR ratio MRs at antiparallel magnetization is 0.5 or more.

The element N may be added to the free layer 2 formed of the FeCoNi alloy having the $L1_0$ ordered structure phase or the $L1_2$ ordered structure phase. An amount of additive is preferably set at 0.5 at % or more to 10 at % or less. When the amount is less than 0.5 at %, a sufficient additive effect cannot be observed. By the addition, a switching current can be reduced through an decrease of the damping constant α. Although the amount of additive may be larger than 10 at %, a temperature of ordering for the $L1_0$ or $L1_2$ ordered structure phases increases, the ordering is blocked, and the degree of ordering is deteriorated.

Since V, Cr, and Mn are complete solid solutions with Fe, these V, Cr, and Mn do not destabilize an ordered crystal structure. In order to use the MR element as an MR element for MRAM, a degree of ordering calculated by a (001) peak and a (002) peak of an X-ray diffraction image must be 0.6 or more. A degree of ordering of 0.8 or more is preferable. When the degree of ordering is less than 0.6, a spin injection magnetic switching current in the patterned MR element is highly probably to fluctuate.

The element M or L may be added to the free layer 2 formed of the FeCoNi alloy having the $L1_0$ ordered structure phase or the $L1_2$ ordered structure phase. An amount of additive is preferably set at 0.5 at % or more to 10 at % or less. When the amount is larger than 10 at %, the free layer 2 has an amorphous structure and does not have an ordered structure. When the amount is less than 0.5 at %, a sufficient additive effect cannot be observed.

The free layer 2 having the $L1_0$ ordered structure phase or the $L1_2$ ordered structure phase is (001)-plane-oriented to function as a perpendicular magnetic film. When the perpendicular magnetic film is used as the free layer 2, a perpendicular magnetic film is preferably used as the pin layer 3. In this configuration, the thickness of the pin layer 3 is preferably larger than that of the free layer 2. This is required to make an amount of magnetization of the pin layer 3 larger than that of the free layer 2 to improve stability of the pin layer 3 against a switching current. In fact, the uniaxial magnetic anisotropic energy Ku or the coercivity Hc of the pin layer 3 also must be larger than those of the free layer 2.

The interface free layer 21 may be formed between the free layer 2 having the $L1_0$ ordered structure phase or the $L1_2$ ordered structure phase and added with any one of the elements N, M, and L and the spacer layer 4. The interface free layer 21 preferably consists of an FeCoNi alloy having the BCC structure. The composition of the FeCoNi alloy in this case is $Fe_{1-x-y}Co_xNi_y$ ($0 \leq x+y<0.2$, $0 \leq x<0.2$, $0 \leq y<0.2$). The interface free layer 21 may be added with any one of the elements N, M, and L according to the descriptions (1-2-1), (1-2-2), and (1-2-3). The thickness of the interface free layer 21 is set at 0.5 nm or more to 2 nm or less. When the thickness is less than 0.5 nm, the effect of the interface free layer 21 can be rarely obtained. When the thickness is larger than 2 nm, the switching current increases.

When an oxide such as MgO, CaO, SrO, or TiO having an NaCl structure is used for the spacer layer 4, the spacer layer 4 is preferably (100)-plane-oriented. In this case, the free layer 2 having the $L1_0$ ordered structure phase or the $L1_2$ ordered structure phase is preferably (001)-plane-oriented. In this case, relations of the orientation of the free layer 2 and that of the spacer layer 4 is as follows.
(100) spacer layer//(100) free layer
[100] spacer layer//[100] free layer (1-3) Specific Example (1-3-1) First Example A specific example of the present invention will be described below.

An MR element to which four-terminal measurement could be performed was formed by the following process. An $SiO_2$ layer having a thickness of 1 μm or more was formed on a surface of an Si substrate by thermal oxidation. A pattern of a lower interconnection was formed on the substrate by a trench. Cu serving as a lower electrode was buried in the trench by using a Damascene method. By using a DC magnetron sputtering method, the MR element according to one embodiment of the present invention was formed. The MR element has the structure in FIG. 9 that includes the structure in FIG. 1 and the like.

More specifically, as shown in FIG. 9, the MR element has a cap layer 23, a free layer 2, a spacer layer 4, a pin layer 3, an antiferromagnetic layer 24, and an underlying layer 25 arranged one after another from the top. The pin layer 3 has an SAF structure to be constituted by a ferromagnetic layer 11, an intermediate layer 12, and a ferromagnetic layer 13 arranged one after another from the top.

The structure obtained by the steps performed up to now was annealed at 375° C. in a magnetic field of 1.5 T and in a vacuum state. Thereafter, the MR element was patterned by an ionmilling method using a hard mask material such as TiN or Ta. Thereafter, a protecting film formed of SiN and an interlayer film formed of $SiO_2$ were formed. A surface of the interlayer film was planarized and polished by chemical mechanical polishing (CMP) to expose an upper surface of the MR element portion. Thereafter, an upper electrode was formed by patterning.

A detailed configuration of the formed MR element will be described below. Materials sandwiched between marks/are denoted as respective layers, arranged one after another from the top, of the MR element shown in FIG. 9. Values in [ ]

denote film thicknesses (unit is nm), and a unit of composition is at %. A magnetic layer in the MR element has in-plane magnetization.

Comparative Example

Ta[5]/Fe[2]/MgO[0.7]/$Co_{40}Fe_{40}B_{20}$[3]/Ru[0.85]/CoFe[3]/Pt Mn[15]/Ta[5]

Example 1

Ta[5]/$Fe_{95}V_5$[2]/MgO[0.7]/$Co_{40}Fe_{40}B_{20}$[3]/Ru[0.85]/CoFe[3]/PtMn[15]/Ta[5]

Example 2

Ta[5]/$Fe_{97}Cr_3$[2]/MgO[0.7]/$Co_{40}Fe_{40}B_{20}$[3]/Ru[0.85]/CoFe[3]/PtMn[15]/Ta[5]

Example 3

Ta[5]/$Fe_{97}Mn_3$[2]/MgO[0.7]/$Co_{40}Fe_{40}B_{20}$[3]/Ru[0.85]/CoFe[3]/PtMn[15]/Ta[5]

By using the MR elements according to Comparative example and Examples 1 to 3, area resistances RA, MR ratios, and spin injection magnetization switching current densities Jc were evaluated. As the sizes and shapes of the MR elements, ellipses each having a width of 100 nm and a length of 200 nm were obtained. The current density Jc was evaluated by a DC pulse current having a pulse width of 1 microsecond. The evaluation results are shown in the following table. The switching current density Jc is an average of switching current densities for switching magnetization of the free layer 2 from parallel to antiparallel and parallel to antiparallel to the pin layer 3, respectively

TABLE 1

|  | RA($\Omega\mu m^2$) | MR ratio(%) | Jc(MA/$cm^2$) |
| --- | --- | --- | --- |
| Comparative example | 15 | 150 | 4.8 |
| Example 1 | 15 | 130 | 1.8 |
| Example 2 | 12 | 123 | 2.3 |
| Example 3 | 13 | 110 | 2.1 |

As shown in Table 1, a conspicuous reducing effect of the switching current density Jc was obtained by adding V, Cr, or Mn.

By using a laminate structure formed of Ta[5]/FeV[5]/MgO[3]/Ta[5]/substrate that are arranged one after another from the top, the damping constant α was evaluated by ferromagnetic-resonance (FMR) measurement. As a result, when V was added to Fe, it was found that the constant was a relative minimum with 5 at % addition. When an amount of additive exceeded 20 at %, the obtained result was a damping constant α that is larger than a damping constant α obtained with no V addition. In case of addition of Mn or Cr, results having the same tendency were obtained.

In the MR element (structure in Embodiment 1) having the free layer 2 formed of FeV, when dependence of an amount of added V on an MR ratio was measured, the MR ratio was conspicuously deteriorated at about 20 at %. Similarly, in the MR films having the free layer 2 formed of FeMn and the free layer 2 formed of FeCr (second and third examples), MR ratios were measured. As a result, it started to show that the MR ratios conspicuously deteriorated at about 15 at % and about 18 at %.

(1-3-2) Second Example

An MR element was formed by the same steps as in Example 1. The size of the MR element is 100 nm×100 nm. The materials and the thicknesses of respective layers are as follows. As in the description in the first example, materials sandwiched between marks/are denoted as respective layers sequentially arranged from the top. Values in [ ] denote film thicknesses (unit is nm), and a unit of composition is at %.

Comparative Example

Ta[5]/$Fe_{50}Pt_{50}$[1.5]/MgO[0.65]/$Co_{40}Fe_{40}B_{20}$[2]/$Fe_{50}Pt_{50}$[30]/Pt[10]/Cr[20]/MgO/Underlying layer Example 1

Ta[5]/$(Fe_{0.95}V_{0.5})_{50}Pt_{50}$[1.5]/MgO[0.65]/$Co_{40}Fe_{40}B_{20}$[2]/$Fe_{50}Pt_{50}$[30]/Pt[10]/Cr[20]/MgO/Underlying layer Example 2

Ta[5]/$(Fe_{0.97}Cr_{0.3})_{50}Pt_{50}$[1.5]/MgO[0.65]/$Co_{40}Fe_{40}B_{20}$[2]/$Fe_{50}Pt_{50}$[30]/Pt[10]/Cr[20]/MgO/Underlying layer Example 3

Ta[5]/$(Fe_{0.97}Mn_{0.3})_{50}Pt_{50}$[1.5]/MgO[0.65]/$Co_{40}Fe_{40}B_{20}$[2]/$Fe_{50}Pt_{50}$[30]/Pt[10]/Cr[20]/MgO/Underlying layer $L1_0$ ordered structure phases of all the FePt-based alloy films were observed from X-ray diffraction images, the degrees of ordering of Comparative example and Examples 1 to 3 were 0.8 or more, and conspicuous deterioration of the degree of ordering caused by addition of the elements were not observed. All the magnetic films of the MR element were perpendicular magnetization films. According to the X-ray diffraction images, the free layers of all the examples were preferentially (001)-plane-oriented.

With respect to the MR elements according to the comparative example and the examples, MR ratios and spin injection magnetization switching current densities were evaluated by a four-terminal method. The results are shown in Table 2.

TABLE 2

|  | RA($\Omega\mu m^2$) | MR ratio(%) | Jc(MA/$cm^2$) |
| --- | --- | --- | --- |
| Comparative example | 12 | 110 | 110 |
| Example 1 | 13 | 105 | 78 |
| Example 2 | 14 | 95 | 82 |
| Example 3 | 13 | 80 | 81 |

As shown in Table 2, even in the MR element having perpendicular magnetization, a conspicuous effect of reducing the switching current density Jc was obtained by adding V, Cr, or Mn.

From a theoretical aspect, when densities of states at Fermi energy are compared on the basis of results of first-principles calculation, it is suggested that the essential damping constant can be reduced in Mn, Cr and V. The effect is particularly significant in V.

Also in the case of using a $Fe_{100-x}Pd_x$ (x: 40-60 at %) alloy free layer having the $L1_0$ ordered structure phase, the same effect as described above was obtained in the aforementioned additives concerning the spin injection magnetization switching current densities Jc. The ratios of reduction of the spin injection magnetization switching current densities Jc were substantially the same in respect of all additive elements and amounts of the added additives. In the case of using a $Fe_{50}Pd_{50}$ alloy free layer, the spin injection magnetization switching current densities Jc was about 10 $MA/cm^2$ with substantially the same layer structure.

Further, in an FePt alloy film or FePd alloy film having the $L1_0$ ordered structure phase, the measured damping constant greatly depends on the (001) orientation and the degree of ordering obtained from the (001) superlattice peak of the $L1_0$ ordered structure phase, regardless of whether Cr, Mn or V is added or not. When the (001) orientation is good, the damping constant is reduced. This result suggests that the degree of ordering is increased. Therefore, the damping constant is reduced, as the degree of $L1_0$ ordering is increased.

From an aspect of the (001) orientation and the flatness of the free layer, the underlying layer of the MR film is important. The Cr layer of 20 nm as the underlying layer of the Pt layer just under the FePt pin layer can be replaced by a (001) oriented TiN, CrN, VN, or NbN film or the like. In this case also, the same effect can be obtained, and the heat resistance can be improved. The optimum thickness of the aforementioned film is 5 to 20 nm.

From the viewpoint of increasing the (001) superlattice peak of the $L1_0$ ordered structure phase and improving the degree of ordering, it is preferable to add Cu and Zn in addition to the above additive elements. The amount of additives is adjusted in a range 1% or more and less than 10%. Cu and Zn are substituted for Fe, Co and Ni in the $L1_0$ ordered structure phase.

In an MR film having a perpendicular magnetization film, the effect of reduction of the damping constant due to reduction of the demagnetizing field can be expected also depending on the size of the MR element. To make the reduction of the demagnetizing field effective, it is preferable that the MR element size be 100 nmΦ or smaller. This is because if the size exceeds 100 nmΦ, the ratio of the reduction of the demagnetizing field is low, and it is difficult to find a difference in flux reversal behavior from a mat film.

(1-3-3) Third Example

An MR element having the same laminate structure as that in Example 1 was formed by the same steps as in Example 1. The size of the MR element is 100 nm×100 nm. The materials and the thicknesses of respective layers are as follows. As in the description in Example 1, materials sandwiched between marks/are denoted as respective layers one after another from the top. Values in [ ] denote film thicknesses (unit is nm), and a unit of composition is at %.

Comparative Example

Ta[5]/$Co_{50}Fe_{50}$[2]/MgO[0.75]/$Co_{40}Fe_{40}B_{20}$[3]/Ru[0.85]/CoFe[3]/PtMn[15]/Ta[5]

Example 1

Ta[5]/$(Co_{0.5}Fe_{0.5})_{97}Si_3$[2]/MgO[0.75]/$Co_{40}Fe_{40}B_{20}$[3]/Ru[0.85]/CoFe[3]/PtMn[15]/Ta[5]

Example 2

Ta[5]/$(Co_{0.5}Fe_{0.5})_{97.5}Ge_{2.5}$[2]/MgO[0.75]/$Co_{40}Fe_{40}B_{20}$[3]/Ru[0.85]/CoFe[3]/PtMn[15]/Ta[5]

Example 3

Ta[5]/$(Co_{0.5}Fe_{0.5})_{98}Ga_2$[2]/MgO[0.75]/$Co_{40}Fe_{40}B_{20}$[3]/Ru[0.85]/CoFe[3]/PtMn[15]/Ta[5]

Example 4

Ta[5]/$(Co_{0.5}Fe_{0.5})_{97}Ta_3$[2]/MgO[0.75]/$Co_{40}Fe_{40}B_{20}$[3]/Ru[0.85]/CoFe[3]/PtMn[15]/Ta[5]

Example 5

Ta[5]/$(Co_{0.5}Fe_{0.5})_{97.5}Sr_{2.5}$[2]/MgO[0.75]/$Co_{40}Fe_{40}B_{20}$[3]/Ru[0.85]/CoFe[3]/PtMn[15]/Ta[5]

Example 6

Ta[5]/$(Co_{0.5}Fe_{0.5})_{98}W_2$[2]/MgO[0.75]/$Co_{40}Fe_{40}B_{20}$[3]/Ru[0.85]/CoFe[3]/PtMn[15]/Ta[5]

Example 7

Ta[5]/$(Co_{0.5}Fe_{0.5})_{97}Nb_3$[2]/MgO[0.75]/$Co_{40}Fe_{40}B_{20}$[3]/Ru[0.85]/CoFe[3]/PtMn[15]/Ta[5]

Example 8

Ta[5]/$(Co_{0.5}Fe_{0.5})_{96.5}Mo_{3.5}$[2]/MgO[0.75]/$Co_{40}Fe_{40}B_{20}$[3]/Ru[0.85]/CoFe[3]/PtMn[15]/Ta[5]

With respect to the MR elements of the comparative examples and the examples, MR ratios and switching current densities Jc were evaluated. The results are shown in Table 3.

TABLE 3

| | RA($\Omega\mu m^2$) | MR ratio(%) | Jc(MA/$cm^2$) |
|---|---|---|---|
| Comparative example | 15 | 150 | 4.8 |
| Example 1 | 15 | 130 | 3.0 |
| Example 2 | 12 | 123 | 3.1 |
| Example 3 | 13 | 110 | 2.9 |
| Example 4 | 10 | 125 | 3.0 |
| Example 5 | 13 | 110 | 2.8 |
| Example 6 | 11 | 105 | 3.2 |
| Example 7 | 13 | 103 | 2.9 |
| Example 8 | 11 | 105 | 3.1 |

As shown in Table 3, a conspicuous effect of reducing the switching current density Jc was obtained by adding Si, Ge, Ga, Ta, Sr, W, Nb, and Mo.

An amount of Si added to $Co_{0.5}Fe_{0.5}$ was studied. An MR element to be evaluated has a laminate structure formed of Ta[5]/CoFeSi[5]/MgO[3]/Ta[5]/substrate (values in [ ] are thicknesses, and unit is nm) arranged one after another from the top. As a result of evaluation, when an amount of additive was 5 at % or less, a clear peak due to the BCC structure was observed by X-ray diffraction measurement. In planar transverse electromagnetic wave (TEM) observation, it was confirmed that 50% or more of the volume of the CoFeSi layer had an amorphous structure when the amount of additive exceeded 5 at %. When the amount was 10 at % or more, the entire CoFeSi layer was constituted by an amorphous structure. When the damping constant α was measured by FMR measurement, a relative minimum value was obtained at an amount of added Si of about 3 at %. This tendency also applied to Ge or Ga.

An amount of Ta added to $co_{0.5}Fe_{0.5}$ was studied. An MR element to be evaluated has a laminate structure formed of Ta[5]/CoFeTa[5]/MgO[3]/Ta[5]/substrate (values in [ ] are thicknesses, and unit is nm) arranged one after another from the top. As a result of evaluation, when an amount of additive was 10 at % or less, a clear peak due to the BCC structure was observed by X-ray diffraction measurement. In planar TEM observation, it was confirmed that 50% or more of the volume of the CoFeTa layer had an amorphous structure when the amount of additive exceeded 10 at %. When the amount was 20 at % or more, the entire CoFeTa layer was constituted by an amorphous structure. This tendency also applied to Sr, Ti, Y, Zr, Nb, Mo, Tc, Hf, W, and Re.

All MR elements and MR films described above can be applied not only a spin-injection magnetization switching element and an MRAM using the same, but may be applicable to a domain wall movable-type element and a memory using the same.

(2) MRAM

A spin injection writing MRAM using the MR element described in item (1) will be described below.

FIG. 10 is a sectional view showing a basic part of one memory cell of the MRAM according to one embodiment of the present invention. As shown in FIG. 10, an upper surface of the MR element 1 is connected to a bit line 32 through an upper electrode 31. A lower surface of the MR element 1 is connected to a source/drain diffusion region 37a on a surface of a semiconductor substrate 36 through a lower electrode 33, a conductive layer (drawing line) 34, and a plug 35.

The source/drain diffusion region 37a constitutes a select transistor Tr together with a source/drain diffusion region 37b, a gate insulating film 38 formed on the semiconductor substrate 36, and a gate electrode 39 formed on the gate insulating film 38. The select transistor Tr and the MR element 1 constitute one memory cell of the MRAM.

The source/drain diffusion region 37b is connected to another bit line 42 through a plug 41.

The plug 35 may be formed under the lower electrode 33 without using the drawing line 34 to directly connect the lower electrode 33 and the plug 35 to each other.

The bit lines 32 and 42, the electrodes 33 and 34, the conductive layer 34, and the plugs 35 and 36 consist of W, Al, AlCu, Cu, and the like.

A plurality of memory cells each shown in FIG. 10 are arranged in a matrix to form a memory cell array of the MRAM. FIG. 11 is a circuit diagram showing a basic part of the MRAM according to the embodiment of the present invention.

As shown in FIG. 11, a plurality of memory cells 53 each constituted by the MR element 1 and the select transistor Tr are arranged in a matrix. One terminals of the memory cells 53 belonging to one column are connected to the same bit line 32, and the other terminals are connected to the same bit line 42. Gate electrodes (word lines) 39 of the memory cells 35 belonging to the same row are connected to each other and connected to a row decoder 51.

The bit line 32 is connected to a current source/sink circuit 55 through a switch circuit 54 such as a transistor. The bit line 42 is connected to a current source/sink circuit 57 through a switch circuit 56 such as a transistor. The current source/sink circuits 55 and 57 supply a write current (switching current) to the connected bit lines 32 and 42 or draws a write current from the bit lines 32 and 42.

The bit line 42 is connected to a read circuit 52. The read circuit 52 may be connected to the bit line 32. The read circuit 52 includes a read current circuit, a sense amplifier, and the like.

In writing, the switch circuits 54 and 56 and the select transistor Tr connected to a memory cell to be written are turned on to form a current path through the target memory cell. Depending on information to be written, one of the current source/sink circuits 55 and 57 functions as a current source, and the other functions as a current sink. As a result, a write current flows in a direction corresponding to the information to be written.

As for a writing rate, spin injection writing can be performed by a current having a pulse width ranging from several nanoseconds to several microseconds.

In reading, the read current circuit supplies a read current, which is too small to cause magnetization switching, to the MR element 1 designated as in the writing. The read circuit 32 compares a current value or a voltage value caused by a resistance according to a state of magnetization of the MR element 1 with a reference value to determine the resistance state.

In the reading, a current pulse width is preferably smaller than that in the writing. In this manner, erroneous writing by a current in the reading can be reduced. This is premised on that an absolute value of a write current value increases when the pulse width of the write current is small.

Thus described, according to the magnetoresistive effect device of embodiments of the present invention, the free layer 2 consists of an FeCoNi alloy having the BCC structure and added with a predetermined element (M, N, or L). For this reason, depending on the type of an element to be added, an interaction of a spin orbital is reduced, or free electrons are localized, so that a damping constant α of the MR element decreases. As a result, a switching current of the MR element can be reduced.

According to the magnetoresistive effect device according to embodiments, the free layer 2 consists of an FeCoNi alloy having the BCC structure and added with a predetermined element (X). For this reason, a heat-resistant free layer is thinned through an increase of a uniaxial magnetic anisotropic energy Ku to reduce an switching current and to make it possible to prevent the heat resistance from being deteriorated.

According to the magnetoresistive effect device of the embodiment, the concentrations of the elements M and N on the interface between the free layer 2 and the spacer layer 4 are lower than those of another portion of the free layer 2. For this reason, a reduction in switching current by adding the elements M and N and a high MR ratio are compatible.

Furthermore, according to the magnetoresistive effect device of the embodiment, the free layer 2 consists of an FeCoNi alloy having an $L1_0$ or $L1_2$ ordered structure phase and added with a predetermined element (M, N, or L). For this reason, the switching current can be reduced while keeping a high heat resistance through a high uniaxial magnetic anisotropic energy Ku.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetoresistive effect element comprising:
    a magnetization fixed layer having substantially fixed magnetization direction;
    a magnetization variable layer having a variable magnetization direction, formed of a magnetic alloy that has a BCC structure and is expressed by $Fe_{1-x-y}Co_xNi_y$ ($0 \leq x+y \leq 1$, $0 \leq x \leq 1$, $0 \leq y \leq 1$), and containing at least one additive element of V, Cr, and Mn in a range of $0 < a \leq 20$ at % (a is a content); and an intermediate layer disposed between the magnetization fixed layer and the magnetization variable layer and formed of a nonmagnetic material, wherein the magnetization direction of the magnetization variable layer is switched by a bidirectional current passing through the magnetization fixed layer, the intermediate layer, and the magnetization variable layer.

2. The element according to claim 1, wherein
an amount of the additive element at a position in the magnetization variable layer decreases as the position gets close to the intermediate layer.

3. The element according to claim 1, wherein
the magnetization variable layer and the magnetization fixed layer have perpendicular magnetization to the film plain thereof respectively.

4. A magnetoresistive effect element comprising:
a magnetization fixed layer having substantially fixed magnetization direction;
a magnetization variable layer having a variable magnetization direction, formed of a magnetic alloy that has a BCC structure and is expressed by $Fe_{1-x-y}Co_xNi_y$ ($0 \leq x+y \leq 1$, $0 \leq x \leq 1$, $0 \leq y \leq 1$), and containing at least one additive element of Si, Ge, and Ga in a range of $0 < a \leq 5$ at % (a is a content); and
an intermediate layer disposed between the magnetization fixed layer and the magnetization variable layer and formed of a nonmagnetic material,
wherein the direction of magnetization of the magnetization variable layer is switched by a bidirectional current passing through the magnetization fixed layer, the intermediate layer, and the magnetization variable layer.

5. The element according to claim 4, wherein
an amount of the additive element at a position in the magnetization variable layer decreases as the position gets close to the intermediate layer.

6. The element according to claim 4, wherein
the magnetization variable layer and the magnetization fixed layer have perpendicular magnetization to the film plain thereof respectively.

7. A magnetoresistive effect element comprising:
a magnetization fixed layer having substantially fixed magnetization direction;
a magnetization variable layer having a variable magnetization direction, formed of a magnetic alloy that has a BCC structure and is expressed by $Fe_{1-x-y}Co_xNi_y$ ($0 \leq x+y \leq 1$, $0 \leq x \leq 1$, $0 \leq y \leq 1$), and containing at least one additive element of Sr, Ti, Y, Zr, Nb, Mo, Tc, Hf, Ta, W, and Re in a range of $0 < a \leq 10$ at % (a is a content); and an intermediate layer disposed between the magnetization fixed layer and the magnetization variable layer and formed of a nonmagnetic material,
wherein the magnetization direction of the magnetization variable layer is switched by a bidirectional current passing through the magnetization fixed layer, the intermediate layer, and the magnetization variable layer.

8. The element according to claim 7, wherein
an amount of the additive element at a position in the magnetization variable layer decreases as the position gets close to the intermediate layer.

9. The element according to claim 7, wherein
the magnetization variable layer and the magnetization fixed layer have perpendicular magnetization to the film plain thereof respectively.

10. A magnetoresistive effect element comprising:
a magnetization fixed layer having substantially fixed magnetization direction;
a magnetization variable layer having a variable magnetization direction, formed of a magnetic alloy expressed by $Fe_{1-x-y}Co_xNi_y$ ($0 \leq x+y \leq 1$, $0 \leq x \leq 1$, $0 \leq y \leq 1$), and containing at least one of Ru, Rh, Pd, Os, Ir, Pt, Au, and Ag; and
an intermediate layer disposed between the magnetization fixed layer and the magnetization variable layer and formed of a nonmagnetic material,
wherein the magnetization direction of the magnetization variable layer is switched by a bidirectional current passing through the magnetization fixed layer, the intermediate layer, and the magnetization variable layer.

11. The element according to claim 10, wherein
the magnetization variable layer has an $L1_0$ ordered structure phase or an $L1_2$ ordered structure phase.

12. The element according to claim 10, wherein
the magnetic variable layer contains at least one of V, Cr, and Mn in a range of $0.5 \leq a \leq 10$ at % (a is a content).

13. The element according to claim 10, wherein
the magnetic variable layer contains at least one of Si, Ge, and Ga in a range of $0.5 \leq a \leq 10$ at % (a is a content).

14. The element according to claim 10, wherein
the magnetic variable layer contains at least one of Sr, Ti, Y, Zr, Nb, Mo, Tc, Hf, Ta, W, and Re in a range of $0.5 \leq a \leq 10$ at % (a is a content).

15. The element according to claim 10, wherein
the magnetization variable layer and the magnetization fixed layer have perpendicular magnetization to the film plain thereof respectively.

* * * * *